United States Patent [19]

Lu et al.

[11] Patent Number: 5,453,148
[45] Date of Patent: Sep. 26, 1995

[54] ADHESIVE FOR CONNECTING A CIRCUIT MEMBER TO A SUBSTRATE

[75] Inventors: Neng-Hsing Lu, Hsinchu; Ning Yang, Taipei; J. C. Deng, Hsinchu; Dick Liao, Hsin-Tein, all of Taiwan, Prov. of China

[73] Assignees: Industrial Technology Research Institute; United Microelectronics Corp., both of Hsinchu, Taiwan, Prov. of China

[21] Appl. No.: 131,602

[22] Filed: Oct. 5, 1993

Related U.S. Application Data

[63] Continuation-in-part of Ser. No. 868,290, Apr. 14, 1992.

[51] Int. Cl.⁶ .................................................. B32B 27/20
[52] U.S. Cl. ............................... 156/272.2; 156/272.4; 252/511; 252/513
[58] Field of Search .......................... 156/272.4, 272.2; 252/511, 512, 513, 514, 508

[56] References Cited

U.S. PATENT DOCUMENTS

| | | | |
|---|---|---|---|
| 3,359,145 | 12/1967 | Salyer et al. | 156/1 |
| 3,762,946 | 10/1973 | Stow et al. | 117/227 |
| 4,170,677 | 10/1979 | Hutcheson | 428/119 |
| 4,218,507 | 8/1980 | Deffeyes et al. | 428/328 |
| 4,546,037 | 10/1985 | King | 428/323 |
| 4,548,862 | 10/1985 | Hartman | 428/323 |
| 4,624,798 | 11/1986 | Gindrup et al. | 252/62.54 |
| 4,644,101 | 2/1987 | Jin et al. | 178/18 |
| 4,667,401 | 5/1987 | Clements et al. | 252/514 |
| 4,737,112 | 4/1988 | Jin et al. | 439/66 |
| 5,147,573 | 9/1992 | Chagnon | 252/62.52 |
| 5,207,841 | 5/1993 | Shigeta et al. | 148/307 |
| 5,256,326 | 10/1993 | Kawato et al. | 252/62.54 |
| 5,266,661 | 11/1993 | Earls et al. | 525/481 |

Primary Examiner—W. Gary Jones
Assistant Examiner—Mark De Simone
Attorney, Agent, or Firm—Spencer, Frank & Schneider

[57] ABSTRACT

An uniaxial adhesive for connecting a circuit member having a plurality of laterally spaced conductive terminals to a substrate including a mounting space having a plurality of laterally spaced conductive paths contains at least 10 percent by weight of compressible hollow conductive particles and a nonconductive polymeric resin. Magnetic field and pressure are applied to the adhesive to gather, concentrate and deform the hollow conductive particles between the conductive terminals and the conductive paths so as to assure excellent electrical connections therebetween.

14 Claims, 1 Drawing Sheet

ADHESIVE FOR CONNECTING A CIRCUIT MEMBER TO A SUBSTRATE

CROSS REFERENCE TO RELATED APPLICATION

This application is a continuation-in-part of U.S. patent application Ser. No. 07/868,290, filed Apr. 14, 1992, which is hereby incorporated by reference.

BACKGROUND OF THE INVENTION

The present invention relates to an electrically conductive adhesive and a method for connecting a circuit member having a plurality of conductive terminals to a substrate including a mounting surface having a plurality of spaced conductive paths utilizing the adhesive.

In many electrical applications, it is desirable to connect an electrical component having a plurality of conductive terminals to a substrate including a plurality of laterally spaced conductive paths such that the conductive terminals are aligned with the conductive paths in a predetermined pattern. For proper function, current is passed from the aligned conductive terminals to the substrate path, or visa a versa. The desired function is referred to as uniaxial conductivity. It is undesirable for current to pass between laterally spaced terminals or conductive pads, such conductivity causing shorting of the circuit.

Conventional methods of connecting conductive terminals to a substrate, for example, a PCB, include soldering techniques. As the soldering temperature is high, up to about 300° C., soldering requires specific temperature resistant components and substrates. Soldering further requires precise dot deposition; that is, application of the solder only on the terminals and not therebetween, to avoid possible shorting of circuits. Therefore, conventional soldering technique requires a number of further treatments to assure the electrical connection between the components and the substrate. This will inevitably increase the manufacturing cost thereof.

U.S. Pat. No. 4,820,376 issued to Lambert discloses a method of fabricating a layer of silicone elastomer material including chains of electrically conducting particles extending essentially perpendicular to the major surfaces of the layer. The method includes the step of removing a portion of at least one of the major surfaces by plasma etching so that the particles at the ends of the chains protrude through the etched surface. However, in the application of the silicone elastomer materials, electrical connection is achieved only when the two protruded ends of the chains are compressed. Further, as the conducting particles chains are randomly distributed in the elastomer, and are not fixed at specific positions, the application of the silicon elastomer layer is thus limited.

U.S. Pat. Nos. 4,667,401, 4,720,740 and 4,868,637 issued to Clements, disclose a method of connecting a circuit member having a plurality of laterally spaced conductive terminals to a substrate including a mounting surface having a plurality of laterally spaced conductive paths. This method includes applying an adhesive including a resin having a viscosity of 10,000 to 440,000 cps and having a 20 to 25 percent by weight content of conductive metal particles suspended therein over the mounting surface; mounting the circuit member on the adhesive while vertically aligning the conductive terminals over preselected ones of the conductive paths; applying pressure against the terminals and the conductive paths to concentrate the percent by weight content of the conductive metal particles to between 40 to 50 percent by weight; and hardening the adhesive under pressure. However, to concentrate the conductive metal particles merely by applying pressure can not guarantee high success rates of electrical connections. And, as the thermal expansivity of the metal conductive terminals is different from that of the adhesives, nonconnection often occurs due to poor contact between the conductive terminals and the adhesives when the surrounding temperature is high.

SUMMARY OF THE INVENTION

An object of the present invention is therefore to provide an adhesive for connecting a circuit member having a plurality of spaced conductive terminals to a substrate including a mounting surface having a plurality of laterally conductive paths.

Another object of the present invention is to provide a method of connecting a circuit member having a plurality of spaced conductive terminals to a substrate including a mounting surface having a plurality of spaced conductive paths.

To attain the above objects, there is provided by the present invention, an adhesive including at least 10 percent by weight of compressible hollow conductive particles and a nonconductive polymeric resin capable of allowing the dispersion of the hollow conductive particles.

According to the present invention, the method of connecting a circuit member having a plurality of spaced conductive terminals to a substrate including a mounting surface having a plurality of laterally spaced conductive paths includes five steps. The first step of the method is to apply the above adhesive over the mounting surface of the substrate. The second step of the method is to mount the circuit member on the adhesive while vertically aligning the conductive terminals over preselected ones of the conductive paths. The third step is to apply a magnetic field vertically to the combination of the mounting surface, the adhesive and the circuit member to gather the conductive particles between the conductive terminals and the conductive paths. The fourth step is to apply a pressure against the circuit member under the magnetic field to cause the flow of the adhesive out from between the conductive terminals and the conductive paths. And the final step is to harden the adhesive.

According to an aspect of the invention, the conductive particles contained in the adhesive are compressible hollow particles so that upon compression the concentration of the particles between the conductive terminals and the conductive paths increases and the particles deform, enabling the increase of the contact area and the applied thickness of the adhesives and thus allowing a reliable electrical connection.

According to another aspect of the invention, before applying pressure against the terminals to concentrate the content of the conductive particles, the magnetic field is applied vertically to the adhesive to gather the conductive particle between the terminals and the conductive paths, thus form an electrical conductive path.

According to a further aspect of the invention, applying pressure against the circuit member is conducted under the magnetic field to assure that the conductive particles are gathered between the terminals and the conductive paths when pressure is applied.

BRIEF DESCRIPTION OF THE DRAWINGS

The present invention can be more fully understood by reading the subsequent detailed description and Examples with references made to the accompanying drawings, wherein.

DETAILED DESCRIPTION OF THE INVENTION

The compressible conductive hollow particles suitable for use in the adhesive of the invention are those made of soft magnetic materials. Examples of the soft magnetic materials are nickel, iron, cobalt, samarium, aluminum, platinum, lead, antimony and their alloys. The hollow conductive particles can be prepared by adding a small amount of additives having properties similar to pure water, such as glycerol or glycol, to an aqueous solution of nitrate of the above metals, atomizing the solution into droplets and pyrolizing the droplets with the introduction of specific gases. The technique for the preparation of the hollow conductive particles is described in detail in copending application Ser. No. 08/074,119 filed on Jun. 8, 1993. Note that the hollow conductive particles suitable for use in the present invention are not limited to those prepared by the above method.

The polymeric resins suitable for use in the adhesive of the present invention must be nonconductive in their polymerized state. Examples of such polymeric resins include epoxy resins and modified epoxy resins with hardeners, acrylic resins and modified acrylic resins, polyester resins and modified polyester resins, silicone resins, phenoxy resins, polyurethane resins, polysulfide, cyanoacrylates, UV-curable polymers and other well known adhesive resins.

The magnetic field applied to the combination of the mounting surface, the adhesive and the circuit member should be in the range from 200 to 5000 Gauss, preferably from 250 to 2000 Gauss.

DETAILED DESCRIPTION OF THE PREFERRED EMBODIMENT

The method according to the present invention will be described hereinunder with example 1 wherein a pair of conductive wires are electrically connected, and example 2 wherein an circuit member is electrically connected to a printed circuit board (PCB).

EXAMPLE 1

Figure 1:
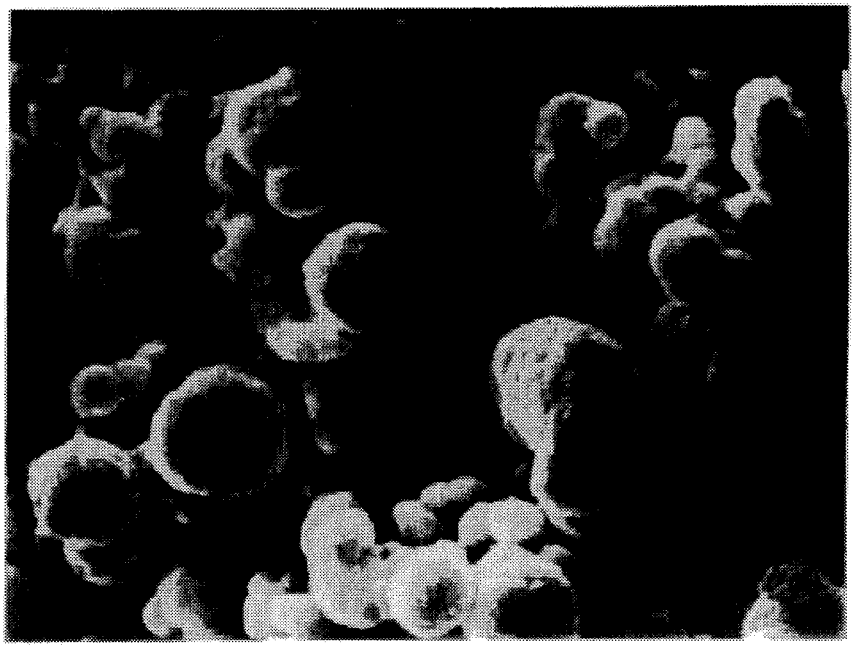
FIG. 1 is a SEM picture of the produced NiO particles of Example 1.
Figure 2:
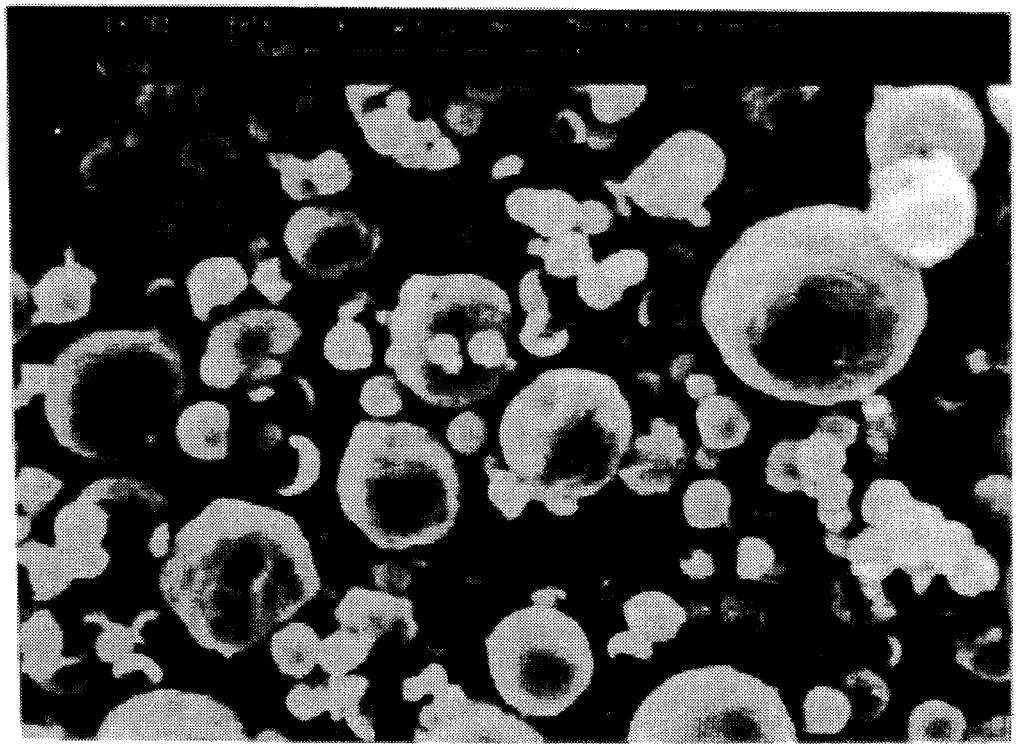
FIG. 2 is a SEM picture of the produced Ni particles of Example 1.

Aqueous solutions having Ni concentrations of 0.1–0.4 moles/L were prepared by adding nickel nitrate to water. To each aqueous solution was added 0.5 percent by weight of glycerol to obtain a precursor solution. The precursor solution was then atomized into a flow of droplets having particle a size ranging from ten odd to several tens micrometers by using an ultrasonic atomizer at an excitation frequency of 1.7 MHz. The flow of droplets was then guided along with air into a reaction tube and heated therein at a temperature of 600° C. to obtain a mass of hollow NiO particles. FIG. 1 is a SEM picture of the produced powder. The produced powder was further heat treated at a temperature of 500° C. under a reducing atmosphere to obtain the hollow Ni particles of the present invention. The SEM picture of the hollow Ni particles is shown in FIG. 2. The hollow Ni particles have an average particle size of 0.8 μm.

A 5.625 g quantity of hollow Ni particles was then added to a mixture of 15 g of modified epoxy resin (EPIC R 1003, EPIC Resins Co. U.S.A.) and 7.5 g of modified aliphatic amine (hardener, EPIC H 5002, EPIC Resins Co.) at room temperature and mixed well. The obtained mixture had a viscosity of 15,000 cps with hollow Ni particles dispersed homogeneously therein.

The above mixture was used as an adhesive according to the invention. The adhesive of the present invention was disposed between two respective ends of a first conductive wire and a second conductive wire with the two ends being encapsulated by the adhesive. The spacing between the two ends was set at 3 mil. The other two respective ends of the first conductive wire and the second conductive wire were respectively connected to a N pole and a S pole of a first magnet and a second magnet. An insulator was arranged between the two magnets. A 300 Gauss magnetic field was applied and the resistance was measured as 3 Ω. This example proves that the hollow conductive particles dispersed in the adhesive can be gathered at and between the two conductive wires when a magnetic field is applied to connect the two conductors.

EXAMPLE 2

Adhesive was prepared by the procedures as set forth in Example 1. The adhesive was coated uniformly over the mounting surface for circuit members of a PCB at a thickness of 3 mil. Circuit members were then mounted on the adhesive while the conductive terminals of the circuit members were aligned vertically with the preselected ones of the conductive paths of the mounting surface. A magnetic field of 300 Gauss was vertically applied on the above combination and circuit members were released to sink by gravity. Appropriate pressure was then applied against the circuit members to allow the connection between the conductive terminals and the PCB. With the magnetic field and the pressure still being applied, the combination was heated to 90° C. for 8 minutes to harden the adhesive. The combination was thereafter cooled to room temperature with the magnetic field and pressure being applied, and tested for the electrical connections. The test results showed that the terminals of the circuit members and the PCB were all in excellent electrical connection.

What is claimed is:

1. An adhesive for connecting a circuit member having a plurality of spaced conductive terminals to a substrate, comprising:

a) at least 10 percent by weight of compressible hollow conductive particles which are made of soft magnetic materials; and b) a nonconductive polymeric resin in which the compressible hollow conductive particles are dispersed.

2. The adhesive as claimed in claim 1, wherein the soft magnetic materials are selected from the group consisting of nickel, iron, cobalt, samarium, aluminum, platinum, lead, antimony, and alloys thereof.

3. The adhesive as claimed in claim 2, wherein the soft magnetic material is nickel.

4. The adhesive as claimed in claim 2, wherein the soft magnetic material is an alloy of nickel and copper.

5. The adhesive as claimed in claim 1, wherein the amount of the compressible hollow conductive particles is 10–25 percent by weight.

6. The adhesive as claimed in claim 1, wherein the nonconductive polymeric resin is selected from the group consisting of epoxy resin, acrylic resin, polyester resin, silicone resin, phenoxy resin, polyurethane resin, polysulfide, cyanoacrylate and UV-curable polymer.

7. The adhesive as claimed in claim 6, wherein the nonconductive polymeric resin is epoxy resin.

8. A method of connecting a circuit member having a plurality of spaced conductive terminals to a substrate including a mounting surface having a plurality of spaced conductive paths, the method comprising:

a) applying an adhesive including at least 10 percent by weight of compressible hollow conductive particles which are made of soft magnetic materials and a nonconductive polymeric resin in which the compressible hollow conductive particles are dispersed over the mounting surface of the substrate;

b) mounting the circuit member on the adhesive while vertically aligning the conductive terminals over preselected ones of the conductive paths;

c) applying a magnetic field vertically to the combination of the mounting surface, the adhesive and the circuit member to gather the conductive particles between the conductive terminals and the conductive paths;

d) applying a pressure against the circuit member under the magnetic field to cause a flow of the adhesive out from between the conductive terminals and the conductive paths, whereby the concentration of the conductive particles between the conductive terminals and the conductive paths increases and the conductive particles deform to promote reliable electrical connection by increasing contact area between the conductive terminals and the conductive paths; and e) hardening the adhesive.

9. The method as claimed in claim 8, wherein, in step c), the applied magnetic field ranges from 200 to 5000 Gauss.

10. The method as claimed in claim 8, wherein the soft magnetic materials are selected from the group selected from the group consisting of nickel, iron, cobalt, samarium, aluminum, platinum, lead, antimony, and alloys thereof.

11. The method as claimed in claim 10, wherein the soft magnetic material is nickel.

12. The method as claimed in claim 8, wherein, in step a), the amount of the compressible hollow conductive particles is 10–25 percent by weight.

13. The method as claimed in claim 8, wherein, in step a), the nonconductive polymeric resin is selected from the group consisting of epoxy resin, polyester resin, acrylate resin, silicone resin, phenoxy resin, polysulfide, and ultraviolet hardenable resin.

14. The method as claimed in claim 13, wherein the nonconductive polymeric resin is epoxy resin.

* * * * *